United States Patent
Kim

(10) Patent No.: US 9,293,725 B2
(45) Date of Patent: Mar. 22, 2016

(54) ORGANIC LIGHT-EMITTING DEVICE AND METHOD OF PRODUCING THE SAME

(71) Applicant: Eung-Do Kim, Yongin (KR)

(72) Inventor: Eung-Do Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 726 days.

(21) Appl. No.: 13/633,154

(22) Filed: Oct. 2, 2012

(65) Prior Publication Data

US 2013/0313527 A1 Nov. 28, 2013

(30) Foreign Application Priority Data

May 22, 2012 (KR) .................. 10-2012-0054453

(51) Int. Cl.
  *H01L 51/54* (2006.01)
  *H01L 51/50* (2006.01)
(52) U.S. Cl.
  CPC .......... *H01L 51/508* (2013.01); *H01L 51/5092* (2013.01)
(58) Field of Classification Search
  CPC ....... H01L 51/508; H01L 51/50; H01L 51/54; H01L 51/5092; H04L 33/14; C09K 11/06
  See application file for complete search history.

(56) References Cited

U.S. PATENT DOCUMENTS

| | | | | |
|---|---|---|---|---|
| 6,013,384 A * | 1/2000 | Kido | .................. | H01L 51/5052 313/504 |
| 2004/0258957 A1* | 12/2004 | Yeh et al. | ...................... | 428/690 |
| 2005/0173700 A1* | 8/2005 | Liao et al. | ....................... | 257/40 |
| 2006/0186792 A1 | 8/2006 | Lee et al. | | |
| 2007/0020483 A1* | 1/2007 | Park et al. | ...................... | 428/690 |
| 2007/0020484 A1 | 1/2007 | Kim et al. | | |
| 2007/0254184 A1* | 11/2007 | Domoto | ........................ | 428/690 |
| 2009/0160319 A1* | 6/2009 | Song | .................... | H01L 51/5048 313/504 |
| 2011/0073843 A1 | 3/2011 | Bonucci | | |
| 2011/0169045 A1 | 7/2011 | Oyamada et al. | | |
| 2011/0309739 A1 | 12/2011 | Song et al. | | |
| 2012/0018707 A1* | 1/2012 | Lee | ...................... | H01L 51/5048 257/40 |
| 2012/0104369 A1* | 5/2012 | Kawata | ................ | C07D 333/76 257/40 |
| 2015/0200379 A1* | 7/2015 | Kim | ....................... | H01L 51/508 257/40 |
| 2015/0263306 A1* | 9/2015 | Kim | .................... | H01L 51/5092 257/40 |

FOREIGN PATENT DOCUMENTS

| | | |
|---|---|---|
| JP | 2012-004116 A | 1/2012 |
| KR | 10-2007-0013002 A | 1/2007 |
| KR | 10-0672535 B1 | 1/2007 |

(Continued)

OTHER PUBLICATIONS

Translation for KR 1006983000000 (publication date Mar. 2007).*
Office Action mailed Jan. 21, 2015 in corresponding Korean Patent Application No. 10-2012-0054453.
Korean Office Action for 10-2012-0054453 dated Jul. 31, 2015; Kim.

*Primary Examiner* — Dawn L. Garrett
(74) *Attorney, Agent, or Firm* — Lee & Morse, P.C.

(57) ABSTRACT

An organic light-emitting device and a method of producing the same, the device including a substrate; a first electrode layer on the substrate; an emission layer on the first electrode layer; an electron transport layer on the emission layer, the electron transport layer including first electron transport layers and a second electron transport layer between the first electron transport layers and the second electron transport layer including a lanthanide metal; and a second electrode layer on the electron transport layer.

19 Claims, 3 Drawing Sheets

(56) References Cited

FOREIGN PATENT DOCUMENTS

| KR | 10-0698300 | B1 | 3/2007 |
| KR | 10-2009-0077040 | A | 7/2009 |
| KR | 10-2011-0036096 | A | 4/2011 |

* cited by examiner

ORGANIC LIGHT-EMITTING DEVICE AND METHOD OF PRODUCING THE SAME

CROSS-REFERENCE TO RELATED APPLICATION

This application claims the benefit of Korean Patent Application No. 10-2012-0054453, filed on May 22, 2012, in the Korean Intellectual Property Office, the disclosure of which is incorporated herein in its entirety by reference.

BACKGROUND

1. Field of the Invention

Embodiments relate to an organic light-emitting device and a method of producing the same.

2. Description of the Related Art

Organic light-emitting devices are self-light emitting devices that emit light when a voltage is applied thereto. Organic light-emitting devices advantageously have high luminance, excellent contrast, multi-colors, wide viewing angles, high response speeds, and a low driving voltage.

An organic light-emitting device has a structure including an organic emission layer disposed between an anode and a cathode. When a voltage is applied across the electrodes, holes are injected from the anode and electrons are injected from the cathode into the organic emission layer. The injected holes and electrons undergo electron exchanges in adjacent molecules in the organic emission layer, thereby migrating to opposite electrodes. An electron-hole pair recombined in a certain molecule forms a molecular exciton in a high-energy excited state. The molecular excitons emit unique light when returning to a low-energy ground state.

SUMMARY

The embodiments provide an organic light-emitting device including an electron transport layer that may block metal from diffusing from a cathode into an emission layer.

An embodiment provides an organic light-emitting device including a substrate, a first electrode layer on the substrate, an emission layer on the first electrode layer, an electron transport layer on the emission layer, wherein the electron transport layer may include first electron transport layers and a second electron transport layer between the first electron transport layers, wherein the second electron transport layer may be formed of or may include a lanthanide metal, and a second electrode layer on the electron transport layer.

The second electrode layer may include an Ag-rich alloy containing a dominant amount of Ag.

The second electrode layer may include an alloy of Mg and Ag.

The second electron transport layer may include ytterbium (Yb) or samarium (Sm).

A thickness of the second electron transport layer may be about 5 Å to about 15 Å.

The electron transport layer may include 2 or more layers of the second electron transport layer.

The organic light-emitting device may further include an electron injection layer between the electron transport layer and the second electrode layer.

The electron injection layer may include a lanthanide metal.

The first electrode layer may be an anode, and the second electrode layer may be a cathode.

An embodiment provides a method of producing an organic light-emitting device that includes providing a substrate, providing a first electrode layer on the substrate, forming a hole injection layer or a hole transport layer on the first electrode layer, forming an emission layer on the hole injection layer or the hole transport layer, forming an electron transport layer on the emission layer, wherein the electron transport layer may include first electron transport layers and at least one second electron transport layer between the first electron transport layers, wherein the at least one second electron transport layer may include a lanthanide metal, forming an electron injection layer on the electron transport layer, forming a second electrode layer on the electron injection layer.

The second electrode layer may include an Ag-rich alloy containing a dominant amount of Ag.

The second electron transport layer may include Yb or Sm.

BRIEF DESCRIPTION OF THE DRAWINGS

The embodiments will become apparent by describing in detail exemplary embodiments with reference to the attached drawings in which.

DETAILED DESCRIPTION

Figure 1:
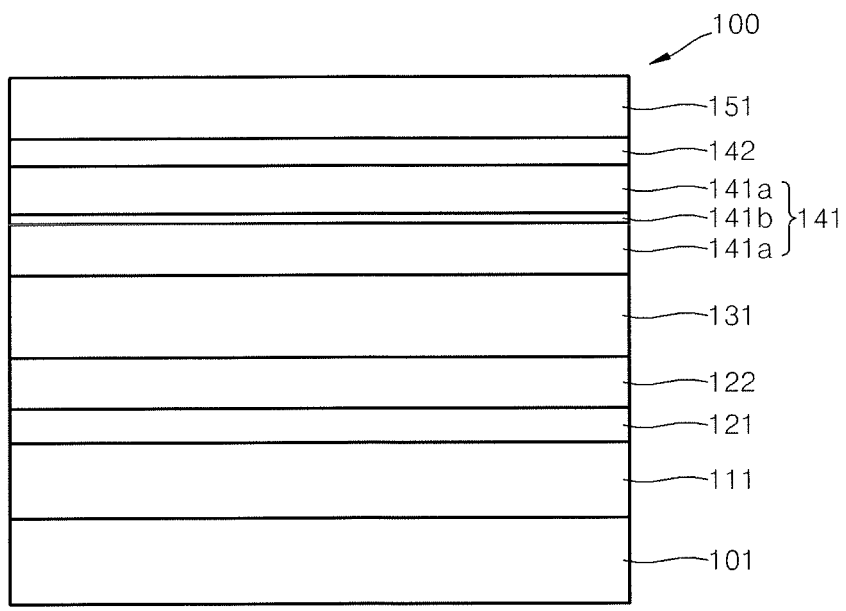
FIG. 1 illustrates a schematic cross-sectional view of an organic light-emitting device according to an embodiment.

The embodiments will now be described more fully with reference to the accompanying drawings, in which exemplary embodiments are shown. The embodiments may, however, be embodied in many different forms and should not be construed as being limited to the embodiments set forth herein; rather, these embodiments are provided so that this disclosure will be thorough and complete, and will fully convey the exemplary embodiments to one of ordinary skill in the art. In the drawings, thicknesses of layers and regions are exaggerated for clarity. Like reference numerals in the drawings denote like elements, and thus repeated description may be omitted. As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a schematic cross-sectional view of an organic light-emitting device 100 according to an embodiment.

The organic light-emitting device 100 may include an anode 111, a hole injection layer 121, a hole transport layer 122, an emission layer (EML) 131, an electron transport layer 141, an electron injection layer 142, and a cathode 151 that are sequentially formed on a substrate 101. The electron transport layer 141 may include first electron transport layers 141a and a metal barrier layer (hereinafter, referred to as, "a second electron transport layer") 141b between the first electron transport layers 141a.

The substrate 101 may be a substrate commonly used for organic light-emitting devices. For example, a glass substrate or a transparent plastic substrate may be used as the substrate 101 in view of excellent mechanical strength, thermal stability, transparency, surface smoothness, ease of handling, and water resistance. The substrate 101 may be formed of an opaque material such as silicon, stainless steel, or the like.

The anode 111 may be formed on the substrate 101. The anode 111 may be formed of a material with a relatively high work function. The anode 111 may be formed of a transparent conductive oxide, e.g., indium tin oxide (ITO), indium zinc oxide (IZO), zinc oxide (ZnO), Al-doped zinc oxide (AZO), indium oxide ($In_2O_3$) or tin oxide ($SnO_2$), but is not limited thereto. The anode 111 may be formed by a vapor deposition method or a sputtering method.

The hole injection layer 121 may be formed on the anode 111. The hole injection layer 121 may be formed of, e.g., a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), poly(3,4-ethylenedioxythiophene)/poly (4-styrenesulfonate) (PEDOT/PSS), polyaniline/dodecylbenzenesulfonic acid (Pani/DBSA), polyaniline/Camphor sulfonicacid (Pani/CSA), polyaniline/poly(4-styrenesulfonate) (PANI/PSS), or the like, but is not limited thereto.

The hole injection layer 121 may be formed using a suitable method, e.g., by vacuum deposition, spin coating, casting, Langmuir-Blodgett (LB) deposition, or the like.

When the hole injection layer 121 is formed using vacuum deposition, the deposition conditions may vary according to a compound used to form the hole injection layer 121 and desired properties of the hole injection layer 121. For example, the deposition conditions may include a deposition temperature of about 100° C. to about 500° C., a vacuum pressure of about $10^{-8}$ Torr to about $10^{-3}$ Torr, and a deposition rate of about 0.01 Å/sec to about 100 Å/sec.

When the hole injection layer 121 is formed using spin coating, the coating conditions may vary according to a compound used to form the hole injection layer 121 and desired properties of the hole injection layer 121. For example, the coating conditions may include a coating speed of about 2,000 rpm to about 5,000 rpm, and a thermal treatment temperature of about 80° C. to about 200° C., wherein the thermal treatment is performed to remove a solvent after coating.

The hole injection layer 121 may have a thickness of about 100 Å to about 10,000 Å, e.g., about 100 Å to about 1,000 Å. When the thickness of the hole injection layer 121 is within such a range, the hole injection layer 121 may have satisfactory hole injection characteristics without a substantial decrease in driving voltage.

The hole transport layer 122 may be formed on the hole injection layer 121. The hole transport layer 122 may include, e.g., a carbazole derivative, such as N-phenylcarbazole or polyvinyl carbazole, a triphenylamine-based material, such as N,N'-bis(3-methylphenyl)-N,N'-diphenyl-[1,1-biphenyl]-4,4'-diamine (TPD), 4,4'-bis[N-(1-naphthyl)-N-phenylamino]biphenyl (NPB), 4,4',4"-tris(N-carbazolyl)triphenylamine (TCTA), or the like, but is not limited thereto.

The hole transport layer 122 may be formed using a suitable method, e.g., by vacuum deposition, spin coating, casting, LB deposition, or the like. When the hole transport layer 122 is formed using vacuum deposition or spin coating, the deposition or coating conditions may vary according to a compound used to form the hole transport layer 122, and may be substantially the same as those applied to form the hole injection layer 121.

An example of a material used to form the hole transport layer 122 may include a carbazole derivative, such as N-phenylcarbazole or polyvinyl carbazole, a triphenylamine-based material, such as N,N'-bis(3-methylphenyl)-N,N'-diphenyl-[1,1-biphenyl]-4,4'-diamine (TPD), 4,4'-bis[N-(1-naphthyl)-N-phenylamino]biphenyl (NPB), 4,4',4"-tris(N-carbazolyl) triphenylamine (TCTA), or the like, but is not limited thereto.

The hole transport layer 122 may have a thickness of about 50 Å to about 1,000 Å, e.g., about 100 Å to about 800 Å. When the thickness of the hole transport layer 122 is within such a range, the hole transport layer may have satisfactory hole transport characteristics without a substantial increase in driving voltage.

In an implementation, a hole functional layer may be formed instead of the hole injection layer 121 and the hole transport layer 122. The hole functional layer may include at least one material selected from the hole injecting materials and the hole transporting materials listed above. The hole functional layer may have a thickness of about 500 Å to about 10,000 Å, e.g., about 100 Å to about 1,000 Å. When the thickness of the hole functional layer is within such a range, the hole functional layer may have satisfactory hole injection and transport characteristics without a substantial increase in driving voltage.

At least one layer of the hole injection layer 121, the hole transport layer 122, and the hole functional layer may further include a charge-generating material, in addition to a known hole injecting material, a known hole transporting material, and/or a material having both hole injecting and transporting capabilities, so as to improve film conductivity.

The charge-generating material may include, e.g., a p-dopant. Non-limiting examples of the p-dopant may include a quinone derivative, such as tetracyanoquinodimethane (TCNQ) or 2,3,5,6-tetrafluoro-tetracyano-1,4-benzoquinonedimethane (F4TCNQ); a metal oxide, such as a tungsten oxide or a molybdenum oxide; and a cyano group-containing compound, but are not limited thereto.

If the hole injection layer, the hole transport layer, or the hole functional layer further includes the charge-generating material, various changes may be made, e.g., the charge-generating material may be uniformly or non-uniformly dispersed in the hole injection layer, the hole transport layer, or the hole functional layer.

Subsequently, the EML 131 may be formed on the hole transport layer 122 or the hole function layer using a suitable method, e.g., by vacuum deposition, spin coating, casting, LB deposition, or the like. When the EML 131 is formed using vacuum deposition or spin coating, the deposition or coating conditions may vary according to a compound used to form the EML 131, and may be substantially the same as those applied to form the hole injection layer 121.

At least one material selected from known light-emitting materials (including both hosts and dopants) may be used as a material for the EML 131.

The host may include, e.g., tris(8-quinolinolato)aluminum (Alq3), 4,4'-N,N'-dicabazole-biphenyl (CBP), poly(n-vinylcabazole) (PVK), 9,10-di(naphthalene-2-yl)anthracene (ADN), TCTA, 1,3,5-tris(N-phenylbenzimidazole-2-yl)benzene (TPBI), 3-tert-butyl-9,1-di(naphth-2-yl) anthracene (TBADN), distyrylarylene (DSA), E3, or 4,4'-bis(9-carbazolyl)-2,2'-dimethyl-biphenyl (CDBP), but is not limited thereto.

A suitable dopant may be used as the dopant. The dopant may include at least one of a fluorescent dopant and a phosphorescent dopant. The phosphorescent dopant may include an organic metal complex including Ir, Pt, Os, Re, Ti, Zr, Hf or a combination thereof, but is not limited thereto.

Examples of red dopants may include Pt(II) octaethylporphyrin (PtOEP), tris(2-phenylisoquinoline)iridium ($Ir(piq)_3$), bis(2-(2'-benzothienyl)pyridinato-N,C3') iridium(acetylacetonate) (Btp$_2$Ir(acac)), or the like, but is not limited thereto.

Examples of green dopants may include tris(2-phenylpyridine) iridium (Ir(ppy)$_3$), bis(2-phenylpyridine)(Acetylacetonato)iridium(III) (Ir(ppy)$_2$(acac)), tris(2-(4-tolyl)phenylpiridine)iridium (Ir(mppy)$_3$), 10-(2-benzothiazolyl)-1,1, 7,7-tetramethyl-2,3,6,7-tetrahydro-1H,5H,11H-[1]benzopyrano[6,7,8-ij]-quinolizin-11-one (C545T), or the like, but is not limited thereto.

Examples of blue dopants may include bis[3,5-difluoro-2-(2-pyridyl)phenyl](picolinato)iridium(III) (F$_2$Irpic), (F$_2$ppy)$_2$Ir(tmd), Ir(dfppz)3,4,4'-bis(2,2'-diphenylethen-1-yl)biphenyl (DPVBi), 4,4'-bis(4-diphenylaminostyryl)biphenyl (DPAVBi), 2,5,8,11-tetra-t-butylperylene (TBPe), or the like, but is not limited thereto.

When the EML 131 includes a host and a dopant, an amount of the dopant may be generally selected within a range of about 0.01 to about 15 parts by weight, based on 100 parts by weight of the host, but is not limited thereto.

The EML 131 may have a thickness of about 100 Å to about 1,000 Å, e.g., about 200 Å to about 600 Å. When the thickness of the EML 131 is within such a range, the EML 131 may have excellent light-emitting characteristics without a substantial increase in driving voltage.

When the EML 131 includes a phosphorescent dopant, a hole blocking layer (HBL) (not shown) may be formed between the hole transport layer 122 and the EML 131 in order to help prevent diffusion of triplet excitons or holes into the electron transport layer 141. The HBL may be formed using a suitable method, e.g., by vacuum deposition, spin coating, casting, LB deposition, or the like. When the HBL is formed using vacuum deposition or spin coating, the deposition or coating conditions may vary according to a compound used to form the HBL, and may be substantially the same as those applied to form the hole injection layer 121. The HBL may be formed of, e.g., oxadiazole derivatives, triazole derivatives, phenanthroline derivatives, or the like. For example, BCP may be used as a material of the HBL.

The HBL (not shown) may have a thickness of about 50 Å to about 1,000 Å, e.g., about 100 Å to about 300 Å. When the thickness of the HBL is within such a range, the HBL may have excellent hole blocking characteristics without a substantial increase in driving voltage.

The electron transport layer 141 may be formed on the EML 131. The electron transport layer 141 may include the first electron transport layers 141a and the second electron transport layer 141b between the first electron transport layers 141a.

The first electron transport layers 141a may each include a suitable electron transport material, e.g., Alq$_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), (bis(2-methyl-8-quinolinolato-N1,O8)-(1,1'-biphenyl-4-olato) aluminum (BAlq), beryllium bis(benzoquinolin-10-olate (Bebq$_2$), 9,10-di(naphthalene-2-yl)anthracene (ADN), or the like, but is not limited thereto The first electron transport layers 141a may be formed using a suitable method, e.g., by vacuum deposition, spin coating, casting, or the like. When the first electron transport layers 141a are formed using vacuum deposition or spin coating, the deposition or coating conditions may vary according to a compound used to form the first electron transport layers 141a, and may be substantially the same as those applied to form the hole injection layer 121.

The first electron transport layers 141a in sum may have a thickness of about 100 Å to about 1,000 Å, e.g., about 150 Å to about 500 Å. When the thickness the first electron transport layers 141a is within such a range, the first electron transport layers 141a may exhibit satisfactory electron transporting characteristics without a substantial increase in driving voltage.

In an implementation, each first electron transport layer 141a may include an electron transporting organic compound and a metal-containing material. The metal-containing material may include a lithium (Li) complex. A non-limiting example of the Li complex may include lithium quinolate (LiQ).

The second electron transport layer 141b may be between the first electron transport layers 141a. The second electron transport layer 141b may be formed of or may include, e.g., a lanthanide metal. In an implementation, the second electron transport layer 141b may be formed of or may include, e.g., ytterbium (Yb), samarium (Sm), lanthanum (La), cerium (Ce), praseodymium (Pr), neodymium (Nd), promethium (Pm), europium (Eu), gadolinium (Gd), terbium (Tb), dysprosium (Dy), holmium (Ho), erbium (Er), or thulium (Tm).

Metal atoms of the cathode 151 may not pass through the second electron transport layer 141b, which may have a different lattice structure from the metal atoms of the cathode 151 or may have barrier properties. Thus, the second electron transport layer 141b may help prevent the metal atoms, e.g., silver (Ag) atoms, from the cathode 151 from diffusing into the EML 131 by passing through the electron transport layer 141.

The second electron transport layer 141b may be formed, e.g., using vacuum deposition. The second electron transport layer 141b may have a thickness of about 1 Å to about 20 Å, e.g., about 5 Å to about 15 Å. When the thickness of the second electron transport layer 141b is within such a range, the second electron transport layer may help prevent diffusion of the metal atoms from the anode 111 into the EML 131 without a substantial decrease in driving voltage.

The electron injection layer 142 (for facilitating injection of electrons from the cathode 151) may be formed on the electron transport layer 141. In an implementation, the electron injection layer 142 may also be formed of or may include a lanthanide metal. The electron injection layer 142 may be formed of or may include, e.g., Yb, Sm, La, Ce, Pr, Nd, Pm, Eu, Gd, Tb, Dy, Ho, Er, or Tm. In an implementation, the electron injection layer 142 may be formed of or may include a suitable material for forming an electron injection layer, such as LiF, NaCl, CsF, Li$_2$O, BaO, or the like, but is not limited thereto. However, the diffusion of the metal atoms from the cathode 151 into the EML 131 may not be sufficiently blocked by the electron injection layer 142 alone.

The electron injection layer 142 may also be formed using vacuum deposition, i.e., like the electron transport layer 141. The electron injection layer 142 may have a thickness of about 1 Å to about 100 Å, e.g., about 5 Å to about 70 Å. When the thickness of the electron injection layer 142 is within such a range, the electron injection layer 142 may exhibit satisfactory electron injecting characteristics without a substantial increase in driving voltage.

The cathode 151 may be formed on the electron injection layer 142. The cathode 151 may be formed of or may include an alloy with a low work function, e.g., may be formed of or include an Ag-rich alloy, i.e., an alloy containing a dominant amount of Ag. For example, the dominant amount of Ag in the Ag-rich alloy of the cathode 151 may indicate that an amount of Ag contained in the cathode 151 exceeds 50% of a total weight of the cathode 151. The cathode 151 may be formed of or may include the Ag-rich alloy, which may be an alloy of Ag with, e.g., Li, Mg, and/or Al. In an implementation, a content ratio (e.g., a volume ratio) of Mg to Ag may be about 1:5 to about 1:10, e.g., about 1:7 to about 1:10. The cathode 151 may exhibit excellent current conductivity. Thus, an efficiency of the organic light-emitting device 100 may be improved.

The cathode 151 may be formed, e.g., using vacuum deposition. The cathode 151 may have a thickness of, e.g., about 20 Å to about 300 Å, or about 50 Å to about 200 Å.

Figure 2A:
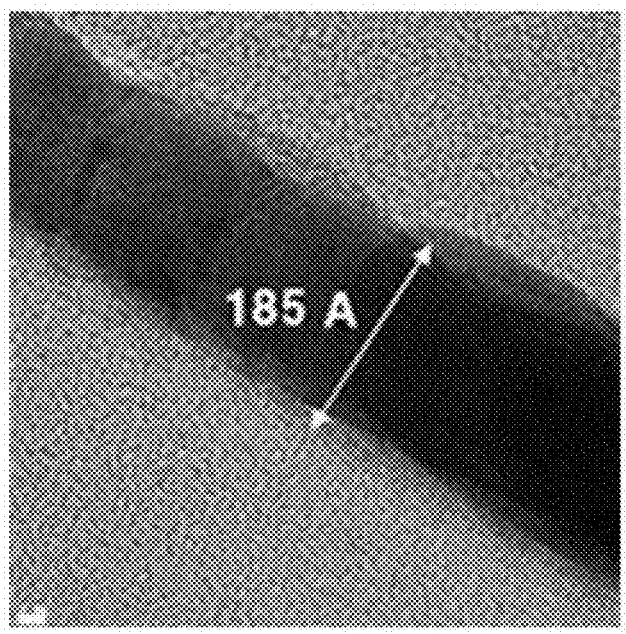
FIG. 2A illustrates a transmission electron microscope (TEM) image of a cathode portion before a high temperature evaluation of an light-emitting device of which the cathode is formed of Ag.
Figure 2B:
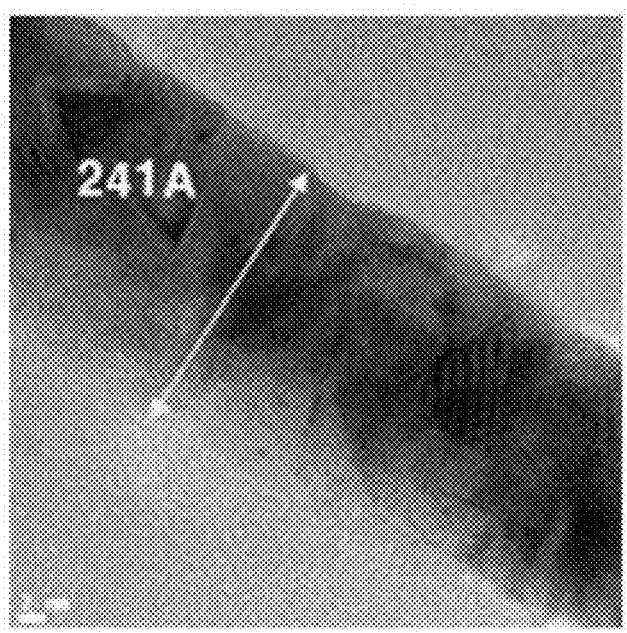
FIG. 2B illustrates a TEM image of the cathode portion after the high temperature evaluation of the light-emitting device of which the cathode is formed of Ag.

FIGS. 2A and 2B respectively illustrate transmission electron microscope (TEM) images of a portion of an Ag-containing cathode before and after high-temperature reliability evaluation of an organic light-emitting device. A high temperature reliability evaluation was performed on an organic light-emitting device including a stacked structure of an electron injection layer LiF: Yb (codeposition) 20 Å/cathode Ag 185 Å at a temperature of 85° C. and humidity of 85% for 120 hours.

In FIG. 2A, a thickness of the cathode was 185 Å before driving the organic light-emitting device at a high temperature. However, in FIG. 2B, a thickness of the cathode was increased to 241 Å after driving the organic light-emitting device at a high temperature. Without being bound by this theory, it is believed that the thickness of the cathode was increased due to diffusion of Ag of the cathode after driving the organic light-emitting device at a high temperature.

The diffusion of Ag may undesirably cause particles and a short circuit, which is evident as the occurrence of dark spots. The dark spots may be formed at a low temperature as well as at a high temperature. As an amount of Ag contained in a cathode increases, more dark spots may be formed, and thus a rate of deterioration of an organic light-emitting device may increase.

However, if a thickness of an electron injection layer or an electron transport layer is increased to help reduce and/or prevent diffusion of Ag, luminous efficiency may be decreased or driving voltage may be increased. Thus, according to an embodiment, the electron injection layer 142 and the electron transport layer 141 (or 241) may serve as a barrier blocking such diffusion of metal, e.g., Ag, from the cathode. Thus, diffusion of Ag from the cathode into an emission layer may be reduced and/or prevented.

A capping layer (not shown) may be formed on the cathode 151 to help improve optical properties and to help maximize luminous efficiency. The capping layer (not shown) may be formed as, e.g., a metal oxide layer, a metal nitride layer, or a metal nitrate layer. The capping layer (not shown) may be formed of, e.g., $MoO_x$ (x=2 to 4), $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, ZrO, AlN, BN, NbN, SiN, TaN, TiN, VN, YbN, ZrN, SiON, AlON, or a mixture thereof.

Figure 3:
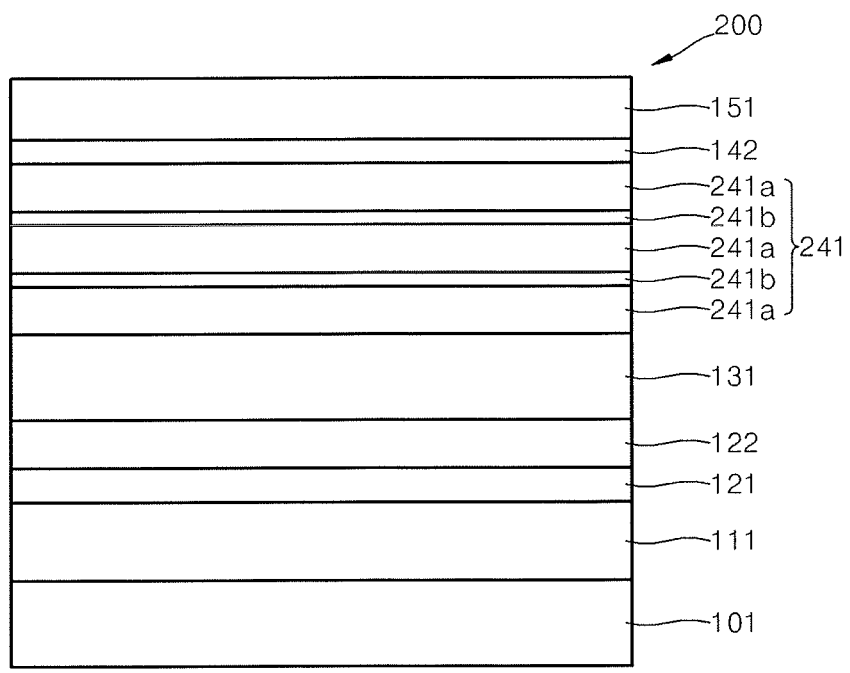
FIG. 3 illustrates a schematic cross-sectional view of an organic light-emitting device according to an embodiment.

FIG. 3 illustrates a schematic cross-sectional view of an organic light-emitting device 200 according to an embodiment. The organic light-emitting device 200 of FIG. 3 is described in terms of a difference with the organic light-emitting device 100 of FIG. 1.

The organic light emitting device 200 of FIG. 3 is different from the organic light-emitting device 100 in that an electron transport layer 241 may include two vertically separated second electron transport layers 241b in or between the first electron transport layers 241a. As two separate second electron transport layers 241b are present in the electron transport layer 241, the number of layers blocking metal atoms from diffusing from the cathode 151 is increased. Thus, diffusion of the metal atoms may be effectively reduced and/or prevented. In an implementation, the electron transport layer 241 may include three or more separate second electron transport layers 241b.

By way of summation and review, a cathode should have a low work function and an excellent current conductivity to facilitate electron supply at a low driving voltage.

An organic light-emitting device according to an embodiment may be applied to an organic light-emitting device of various structures, such as an organic light-emitting device emitting monochromatic light, an organic light-emitting device emitting light of different colors, or an organic light-emitting device emitting white light.

A lanthanide metal layer may be included in an electron transport layer in order to reduce the possibility of and/or prevent metal atoms from diffusing from a cathode to an emission layer. Accordingly, the occurrence of undesirable dark spots may be reduced, and thus, a reliability of an organic light-emitting device may be improved.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light-emitting device, comprising:
    a substrate;
    a first electrode layer on the substrate;
    an emission layer on the first electrode layer;
    an electron transport layer on the emission layer, the electron transport layer including first electron transport layers and at least one second electron transport layer, wherein the at least one second electron transport layer:
    is between the first electron transport layers,
    has a thickness of about 5 Å to about 15 Å, and
    includes a lanthanide metal; and
    a second electrode layer on the electron transport layer.

2. The organic light-emitting device of claim 1, wherein the second electrode layer includes an Ag-rich alloy containing a dominant amount of Ag.

3. The organic light-emitting device of claim 1, wherein the second electrode layer includes an alloy of Mg and Ag.

4. The organic light-emitting device of claim 3, wherein a volume ratio of Mg to Ag in the second electrode layer is about 1:5 to about 1:10.

5. The organic light-emitting device of claim 1, wherein the at least one second electron transport layer includes ytterbium or samarium.

6. The organic light-emitting device of claim 1, wherein the electron transport layer includes two or more layers of the second electron transport layer.

7. The organic light-emitting device of claim 1, wherein the first electron transport layers each include $Alq_3$, 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), (bis(2-methyl-8-quinolinolato-N1,O8)-(1,1'-biphenyl-4-olato)aluminum (BAlq), beryllium bis (benzoquinolin-10-olate) ($Bebq_2$), or 9,10-di(naphthalene-2-yl)anthracene (ADN).

8. The organic light-emitting device of claim 1, wherein the first electron transport layers each have a thickness of about 150 Å to about 500 Å.

9. The organic light-emitting device of claim 1, wherein the first electron transport layers each further include a lithium complex.

10. The organic light-emitting device of claim 1, further comprising an electron injection layer between the electron transport layer and the second electrode layer.

11. The organic light-emitting device of claim 10, wherein the electron injection layer includes a lanthanide metal.

12. The organic light-emitting device of claim 1, further comprising at least one of a hole transport layer or a hole injection layer between the first electrode layer and the emission layer.

13. The organic light-emitting device of claim 12, wherein the hole transport layer or the hole injection layer further includes a charge-generating material.

14. The organic light-emitting device of claim 13, wherein the charge-generating material is a p-type dopant.

15. The organic light-emitting device of claim 1, further comprising a hole injection transport layer between the first electrode layer and the emission layer, the hole injection transport layer having both hole injecting and transporting capabilities.

16. The organic light-emitting device of claim 1, wherein:
the first electrode layer is an anode, and
the second electrode layer is a cathode.

17. A method of producing an organic light-emitting device, the method comprising:
providing a substrate;
providing a first electrode layer on the substrate;
forming a hole injection layer or a hole transport layer on the first electrode layer;
forming an emission layer on the hole injection layer or the hole transport layer;
forming an electron transport layer on the emission layer such that the electron transport layer includes first electron transport layers and at least one second electron transport layer, wherein the at least one second electron transport layer:
is between the first electron transport layers,
has a thickness of about 5 Å to about 15 Å, and
includes a lanthanide metal;
forming an electron injection layer on the electron transport layer; and
forming a second electrode layer on the electron injection layer.

18. The method of claim 17, wherein the second electrode layer includes an Ag-rich alloy containing a dominant amount of Ag.

19. The method of claim 17, wherein the at least one second electron transport layer includes ytterbium or samarium.

* * * * *